(12) United States Patent
Peng et al.

(10) Patent No.: US 9,154,670 B1
(45) Date of Patent: Oct. 6, 2015

(54) IMAGE CAPTURING MODULE HAVING A BUILT-IN TOPMOST DUSTPROOF STRUCTURE

(71) Applicant: LARVIEW TECHNOLOGIES CORP., Taoyuan County (TW)

(72) Inventors: Kuo-Hao Peng, Hsinchu (TW); Po-Chih Hsu, Hsinchu (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 14/330,260

(22) Filed: Jul. 14, 2014

(51) Int. Cl.
  *H04N 5/217* (2011.01)
  *G02B 7/02* (2006.01)
  *H04N 5/225* (2006.01)
  *H01L 27/146* (2006.01)
  *H04N 7/18* (2006.01)
  *G02B 7/14* (2006.01)

(52) U.S. Cl.
  CPC ............. *H04N 5/2171* (2013.01); *H04N 5/217* (2013.01); *G02B 7/02* (2013.01); *G02B 7/14* (2013.01); *H01L 27/146* (2013.01); *H04N 5/225* (2013.01); *H04N 7/18* (2013.01)

(58) Field of Classification Search
  CPC .......... H01L 27/146; G02B 7/02; G02B 7/14; H04N 5/217; H04N 5/2171; H04N 5/225; H04N 7/18
  See application file for complete search history.

(56) References Cited

U.S. PATENT DOCUMENTS

| | | | |
|---|---|---|---|
| 7,460,317 B2 * | 12/2008 | Webster et al. | 359/811 |
| 2007/0064317 A1 * | 3/2007 | Chen et al. | 359/811 |
| 2013/0329126 A1 * | 12/2013 | Brodie et al. | 348/360 |
| 2014/0002676 A1 * | 1/2014 | Ning | 348/187 |

* cited by examiner

*Primary Examiner* — Victor A Mandala
(74) *Attorney, Agent, or Firm* — Li & Cai Intellectual Property (USA) Office

(57) ABSTRACT

An image capturing module having a built-in topmost dustproof structure includes an image sensing unit, a housing frame and an actuator structure. The image sensing unit includes a carrier substrate and an image sensing chip on the carrier substrate. The housing frame is disposed on the carrier substrate to surround the image sensing chip. The actuator structure includes a lens holder disposed on the housing frame and a movable lens assembly movably disposed inside the lens holder. The lens holder has a first topmost surrounding structure disposed on the inner surrounding surface and the topmost side thereof. The movable lens assembly has a second topmost surrounding structure disposed on the outer perimeter surface and the topmost side thereof and above the first topmost surrounding structure. The first topmost surrounding structure and the second topmost surrounding structure are mated with each other to form the built-in topmost dustproof structure.

10 Claims, 5 Drawing Sheets

IMAGE CAPTURING MODULE HAVING A BUILT-IN TOPMOST DUSTPROOF STRUCTURE

BACKGROUND OF THE INVENTION

1. Field of the Invention

The instant disclosure relates to an image capturing module, and more particularly to an image capturing module having a built-in topmost dustproof structure.

2. Description of Related Art

Recently, it becomes more and more popular for portable devices such as mobile phones or PDA to be equipped with an imaging module. Furthermore, since the market requires these portable devices to have more powerful functions and smaller sizes, it is necessary for the imaging module to generate high quality pictures and to be of small size accordingly. One improvement of picture quality is to increase the number of pixel. The pixel number of an imaging module has already increased from the VGA-level 30 pixels to 2, 5, 8, 13 or even 41 million pixels, which is now common in the market. Another improvement lies in the definition of the image. Thus, the imaging module of a portable device also develops from a fixed-focus mode to auto-focus mode or even optical zoom mode.

The auto-focus mode employs the principle of moving the lens in the imaging module suitably according to various distances of targets, whereby the optical image of the desired target can be focused correctly on an image sensor so as to generate a clear image. The common ways of activating the lens to move in the imaging module include activating by a stepping motor, piezoelectric motor and voice coil motor (VCM). However, there is no any dustproof design for the prior imaging module.

SUMMARY OF THE INVENTION

One aspect of the instant disclosure relates to an image capturing module having a built-in topmost dustproof structure.

One of the embodiments of the instant disclosure provides an image capturing module having a built-in topmost dustproof structure, comprising: an image sensing unit, a housing frame and an actuator structure. The image sensing unit includes a carrier substrate and an image sensing chip disposed on the carrier substrate and electrically connected to the carrier substrate. The housing frame is disposed on the carrier substrate to surround the image sensing chip. The actuator structure is disposed on the housing frame and above the image sensing chip, wherein the actuator structure includes a lens holder disposed on the housing frame and a movable lens assembly movably disposed inside the lens holder. More precisely, the lens holder has a first topmost surrounding structure disposed on the inner surrounding surface and the topmost side thereof, and the movable lens assembly has a second topmost surrounding structure disposed on the outer perimeter surface and the topmost side thereof and above the first topmost surrounding structure, and the first topmost surrounding structure of the lens holder and the second topmost surrounding structure of the movable lens assembly are mated with each other to form the built-in topmost dustproof structure.

Another one of the embodiments of the instant disclosure provides an image capturing module having a built-in topmost dustproof structure, comprising: an image sensing unit, a housing frame and an actuator structure. The image sensing unit includes a carrier substrate and an image sensing chip disposed on the carrier substrate and electrically connected to the carrier substrate. The housing frame is disposed on the carrier substrate to surround the image sensing chip. The actuator structure is disposed on the housing frame and above the image sensing chip, wherein the actuator structure includes a lens holder disposed on the housing frame and a movable lens assembly disposed inside the lens holder, the lens holder includes a surrounding movable member movably disposed therein, the movable lens assembly is fixed inside the surrounding movable member, and the movable lens assembly is movably disposed inside the lens holder through the surrounding movable member. More precisely, the surrounding movable member of the lens holder has a first topmost surrounding structure disposed on the inner surrounding surface and the topmost side thereof, and the movable lens assembly has a second topmost surrounding structure disposed on the outer perimeter surface and the topmost side thereof and above the first topmost surrounding structure, and the first topmost surrounding structure of the surrounding movable member and the second topmost surrounding structure of the movable lens assembly are mated with each other to form the built-in topmost dustproof structure.

More precisely, the image capturing module further comprises an optical filter disposed on the housing frame and between the image sensing chip and the movable lens assembly, wherein the housing frame has a top opening disposed on the top side thereof and between the image sensing chip and the movable lens assembly, and the top opening of the housing frame is enclosed by the optical filter, wherein both the inner surrounding surface of the lens holder and the outer perimeter surface of the movable lens assembly are threadless surfaces or thread surfaces.

More precisely, the first topmost surrounding structure has a first surrounding extending portion substantially horizontally extended from the inner surrounding surface and the topmost side of the lens holder and toward the outer perimeter surface of the movable lens assembly and a first surrounding blocking portion substantially upwardly and vertically extended from the first surrounding extending portion, and both the first surrounding extending portion and the first surrounding blocking portion of the lens holder are sequentially connected to form a first surrounding receiving space, wherein the second topmost surrounding structure has a second surrounding extending portion substantially horizontally extended from the outer perimeter surface and the topmost side of the movable lens assembly and substantially horizontally toward the inner surrounding surface of the lens holder, and the second surrounding extending portion is adjacent to the first surrounding blocking portion and disposed above the first surrounding blocking portion.

More precisely, the first topmost surrounding structure has a first surrounding extending portion substantially horizontally extended from the inner surrounding surface and the topmost side of the lens holder and toward the outer perimeter surface of the movable lens assembly and a first surrounding blocking portion substantially upwardly and vertically extended from the first surrounding extending portion, and both the first surrounding extending portion and the first surrounding blocking portion of the lens holder are sequentially connected to form a first surrounding receiving space, wherein the second topmost surrounding structure has a second surrounding extending portion substantially horizontally extended from the outer perimeter surface and the topmost side of the movable lens assembly and substantially horizontally toward the inner surrounding surface of the lens holder and a second surrounding blocking portion downwardly and vertically extended from the second surrounding extending portion, the second surrounding extending portion is adjacent to the first surrounding blocking portion and disposed above the first surrounding blocking portion, and the first surrounding extending portion is adjacent to the second surrounding blocking portion and disposed under the second surrounding blocking portion.

More precisely, the outer perimeter surface, the second surrounding extending portion and the second surrounding blocking portion of the movable lens assembly are sequentially connected to form a second surrounding receiving space, one portion of the first surrounding blocking portion is received in the second surrounding receiving space, and one portion of the second surrounding blocking portion is received in the first surrounding receiving space.

Therefore, because the lens holder has a first topmost surrounding structure disposed on the inner surrounding surface and the topmost side thereof and the movable lens assembly has a second topmost surrounding structure disposed on the outer perimeter surface and the topmost side thereof and above the first topmost surrounding structure, the first topmost surrounding structure of the lens holder and the second topmost surrounding structure of the movable lens assembly can be mated with each other to form the built-in topmost dustproof structure. Whereby, when the external dust passes through the gap between a non-movable external casing of the lens holder and a second surrounding extending portion of the movable lens assembly to get into the built-in topmost dustproof structure that is composed of the first topmost surrounding structure and the second topmost surrounding structure, the external dust is obstructed by a first surrounding blocking portion of the first topmost surrounding structure (or a first surrounding blocking portion of the first topmost surrounding structure and a second surrounding blocking portion of the second topmost surrounding structure), so as to gather the external dust in a first surrounding receiving space of the first topmost surrounding structure.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

The embodiments of "an image capturing module having a built-in topmost dustproof structure" of the instant disclosure are described below by means of specific examples, and other advantages and objectives of the instant disclosure can be easily understood by one skilled in the art from the disclosure of the description. The instant disclosure can be embodied or applied in other different embodiments, and various modifications and variations can be made to various details in the description for different applications without departing the scope of the instant disclosure. Also, the drawings of the instant disclosure are provided for only simple illustrations, and are not drawn to scale, that is, do not reflect the actual relative dimensions. The following embodiments are provided to describe in detail the concept of the instant disclosure, and are not intended to limit the scope thereof in any way.

First Embodiment

Figure 1:
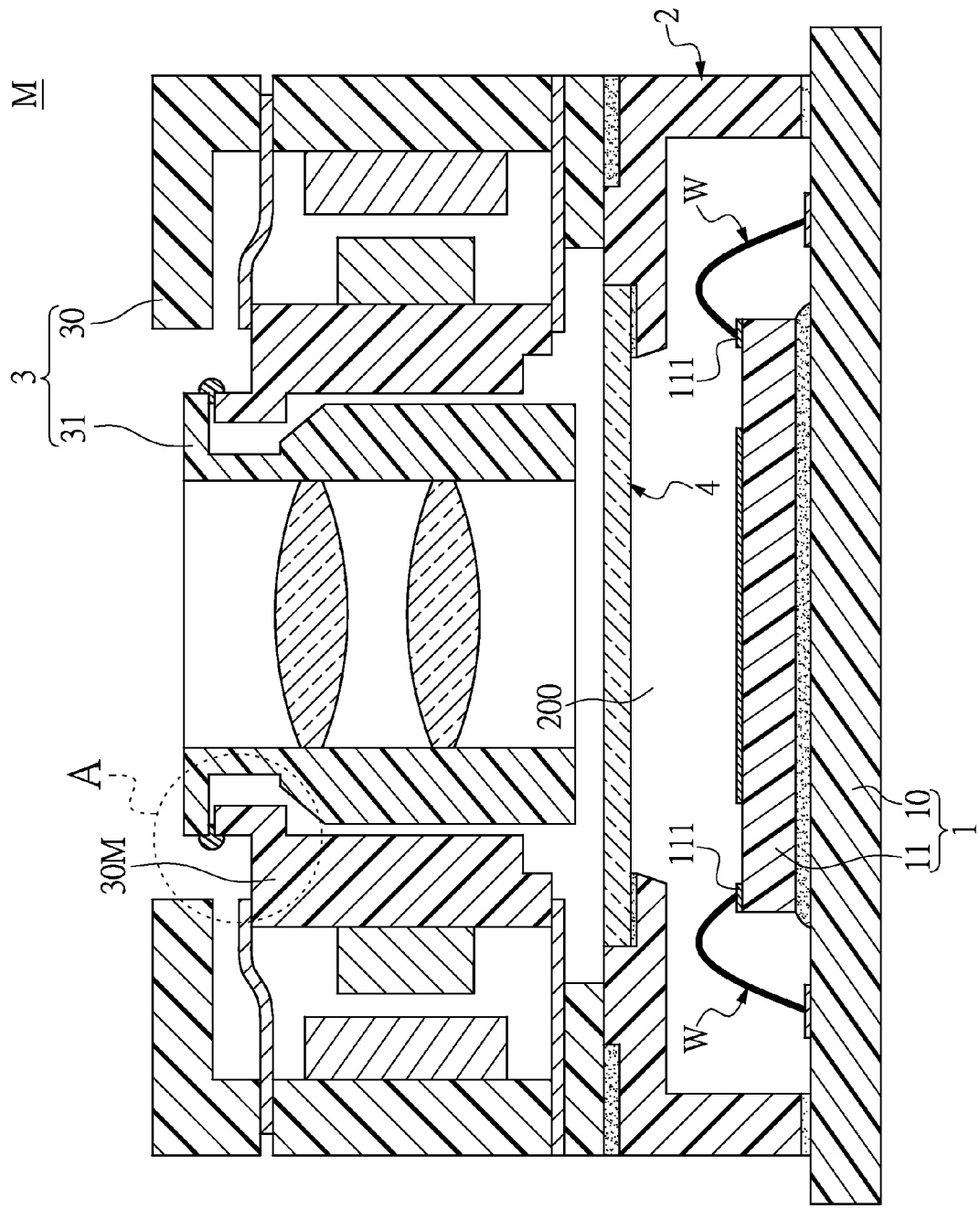
FIG. 1 shows a lateral, cross-sectional, schematic view of the image capturing module having a built-in topmost dustproof structure and using a voice coil motor actuator according to the first embodiment of the instant disclosure.
Figure 2:
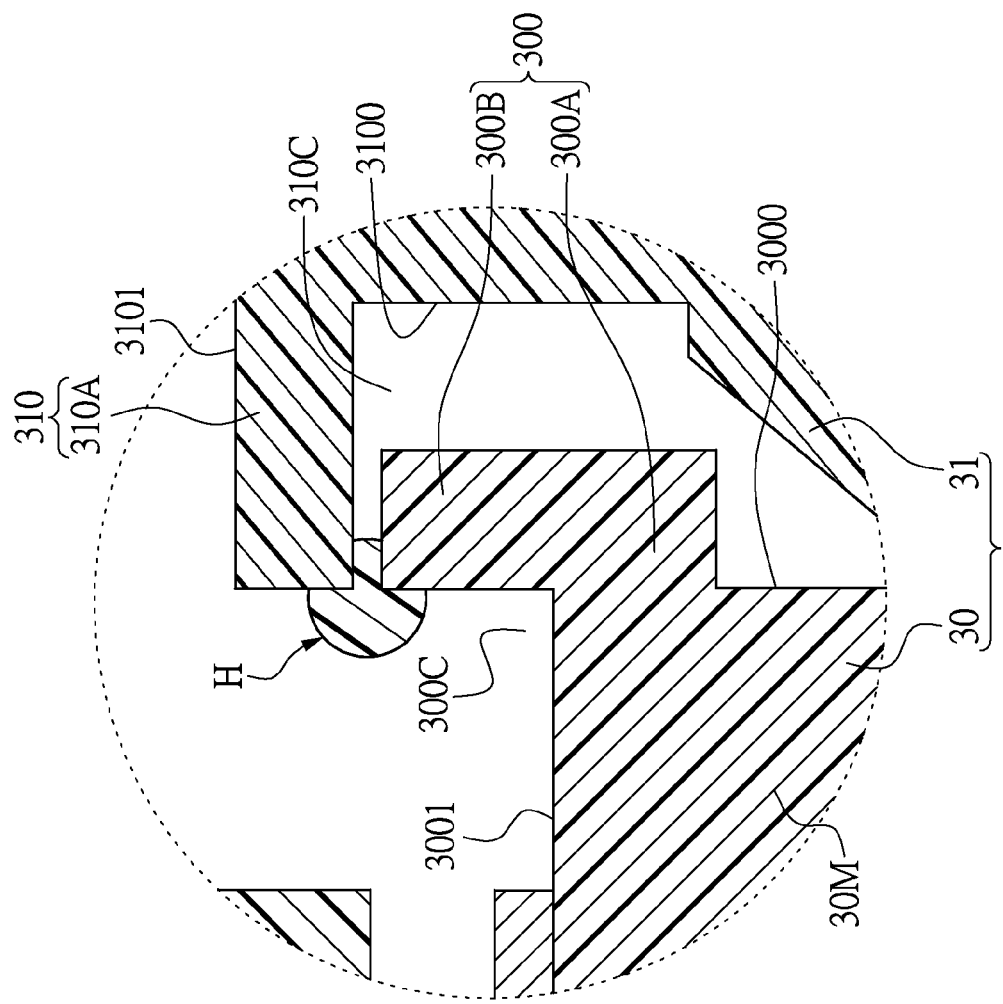
FIG. 2 is an enlarged view taken on part A of FIG. 1.
Figure 3:
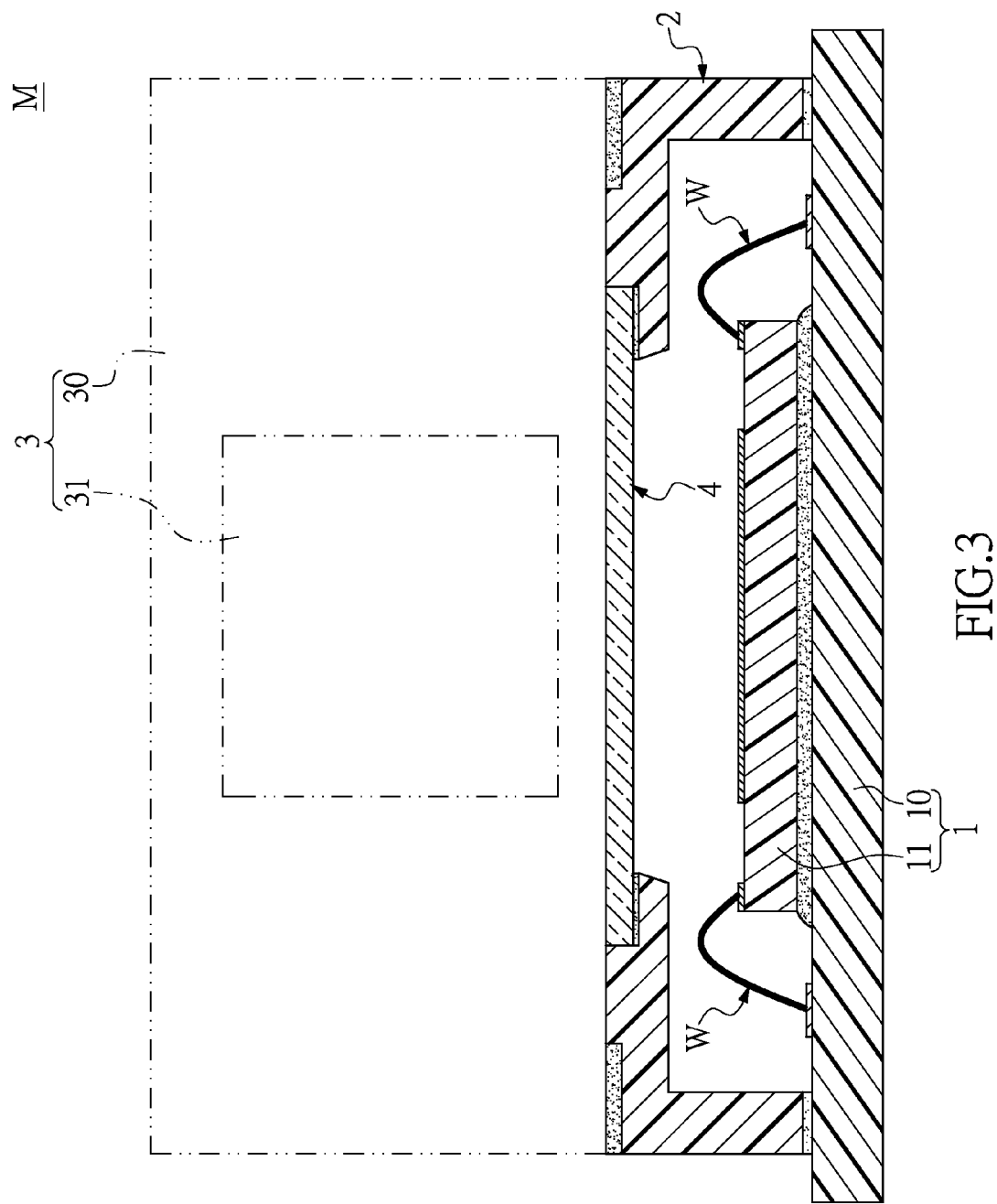
FIG. 3 shows a lateral, cross-sectional, schematic view of the image capturing module having a built-in topmost dustproof structure and using another type of actuator according to the first embodiment of the instant disclosure.

Referring to FIG. 1 and FIG. 2, FIG. 2 is an enlarged view taken on part A of FIG. 1, the first embodiment of the instant disclosure provides an image capturing module M having a built-in topmost dustproof structure, comprising: an image sensing unit 1, a housing frame 2 and an actuator structure 3.

First, as shown in FIG. 1, the image sensing unit 1 includes a carrier substrate 10 (or a carrying substrate) and an image sensing chip 11 disposed on the carrier substrate 10 and electrically connected to the carrier substrate 10. For example, the image sensing chip 11 may be a CMOS (Complementary Metal-Oxide-Semiconductor) image sensing chip, and the image sensing chip 11 can be adhesively disposed on the carrier substrate 10 through any type of adhesive material (not labeled) such as UV adhesive glue, thermosetting glue or curing glue applied to oven etc. In addition, the carrier substrate 10 may be a circuit substrate having a plurality of conductive pads (not labeled) disposed on the top surface of the circuit substrate, and the image sensing chip 11 has a plurality of conductive pads 111 disposed on the top surface of the image sensing chip 11. Each conductive pad 111 of the image sensing chip 11 can be electrically connected to the corresponding conductive pad (not labeled) of the carrier substrate 10 through a corresponding conductive wire W, thus the image sensing chip 11 can be electrically connected with the carrier substrate 10 through the conductive wires W.

Moreover, as shown in FIG. 1, the housing frame 2 is disposed on the carrier substrate 10 to surround the image sensing chip 11. The actuator structure 3 is disposed on the housing frame 2 and above the image sensing chip 11, and the actuator structure 3 includes a lens holder 30 disposed on the housing frame 2 and a movable lens assembly 31 movably disposed inside the lens holder 30. For example, the housing frame 2 can be adhesively disposed on the carrier substrate 10 through any type of adhesive material (not labeled) such as UV adhesive glue, thermosetting glue or curing glue applied to oven etc., and the lens holder 30 also can be adhesively disposed on the housing frame 2 through any type of adhesive material (not labeled) such as UV adhesive glue, thermosetting glue or curing glue applied to oven etc, and the movable lens assembly 31 may be an optical lens group that is composed of a plurality of optical lenses (not labeled). In addition, it is worth mentioning that the actuator structure 3 may be a voice coil motor actuator, but the voice coil motor actuator used in the first embodiment is merely an example and is not meant to limit the instant disclosure.

More precisely, as shown in FIG. 1, the image capturing module M further comprises an optical filter 4 disposed on the housing frame 2 and between the image sensing chip 11 and the movable lens assembly 31. In addition, the housing frame 2 has a top opening 200 disposed on the top side thereof and between the image sensing chip 11 and the movable lens assembly 31, and the top opening 200 of the housing frame 2 is enclosed by the optical filter 4.

More precisely, referring to FIG. 1 and FIG. 2, the lens holder 30 has a first topmost surrounding structure 300 disposed on the inner surrounding surface 3000 (i.e., an inner wall surface) and the topmost side 3001 thereof, and the movable lens assembly 31 has a second topmost surrounding structure 310 disposed on the outer perimeter surface 3100 (i.e., an outer periphery surface) and the topmost side 3101 thereof and above the first topmost surrounding structure 300, and the first topmost surrounding structure 300 of the lens holder 30 and the second topmost surrounding structure 310 of the movable lens assembly 31 are mated with each other (may be separated from each other for example) to form the built-in topmost dustproof structure.

For example, as shown in FIG. 2, the first topmost surrounding structure 300 has a first surrounding extending portion 300A substantially horizontally extended from the inner surrounding surface 3000 and the topmost side 3001 of the lens holder 30 and toward the outer perimeter surface 3100 of the movable lens assembly 31 and a first surrounding blocking (retaining or obstructing) portion 300B substantially upwardly and vertically extended from the first surrounding extending portion 300A, and both the first surrounding extending portion 300A and the first surrounding blocking portion 300B of the lens holder 30 are sequentially connected (to one another) to form a first surrounding receiving space 300C. In addition, the second topmost surrounding structure 310 has a second surrounding extending portion 310A substantially horizontally extended from the outer perimeter surface 3100 and the topmost side 3101 of the movable lens assembly 31 and substantially horizontally toward the inner surrounding surface 3000 of the lens holder 30, and the second surrounding extending portion 310A is adjacent to the first surrounding blocking portion 300B and disposed above the first surrounding blocking portion 300B. Moreover, both the inner surrounding surface 3000 of the lens holder 30 and the outer perimeter surface 3100 of the movable lens assembly 31 are thread surfaces or threadless (or unthreaded) surfaces (i.e., without any thread or screw on the inner surrounding surface 3000 and the outer perimeter surface 3100).

More precisely, referring to FIG. 1 and FIG. 2, the lens holder 30 includes a surrounding movable member 30M movably disposed therein, and the movable lens assembly 31 can be fixed inside the surrounding movable member 30M through only two or at least two separate bonding glue H. Hence, the instant disclosure does not need to use a continuous bonding glue or ring to fix the movable lens assembly 31 inside the surrounding movable member 30M, so as to decrease the manufacturing time and the manufacturing cost. In addition, because the movable lens assembly 31 is fixed inside the surrounding movable member 30M through the at least two separate bonding glue H, the movable lens assembly 31 can be movably disposed inside the lens holder 30 through the surrounding movable member 30M. Moreover, both the inner surrounding surface 3000 of the surrounding movable member 30M and the outer perimeter surface 3100 of the movable lens assembly 31 are threadless surfaces or thread surfaces. Furthermore, the first topmost surrounding structure 300 has a first surrounding extending portion 300A substantially horizontally extended from the inner surrounding surface 3000 and the topmost side 3001 of the surrounding movable member 30M and toward the outer perimeter surface 3100 of the movable lens assembly 31 and a first surrounding blocking portion 300B substantially upwardly and vertically extended from the first surrounding extending portion 300A, and both the first surrounding extending portion 300A and the first surrounding blocking portion 300B of the surrounding movable member 30M are sequentially connected to form a first surrounding receiving space 300C. The second topmost surrounding structure 310 has a second surrounding extending portion 310A substantially horizontally extended from the outer perimeter surface 3100 and the topmost side 3101 of the movable lens assembly 31 and substantially horizontally toward the inner surrounding surface 3000 of the surrounding movable member 30M, and the second surrounding extending portion 310A is adjacent to the first surrounding blocking portion 300B and disposed above the first surrounding blocking portion 300B.

Whereby, when the external dust passes through the gap between a non-movable external casing (not labeled) of the lens holder 30 and the second surrounding extending portion 310A of the movable lens assembly 31 to get into the built-in topmost dustproof structure that is composed of the first topmost surrounding structure 300 and the second topmost surrounding structure 310, the external dust is obstructed by the first surrounding blocking portion 300B, so as to gather the external dust in the first surrounding receiving space 300C.

It is worth mentioning that when the movable lens assembly 31 is fixed inside the surrounding movable member 30M through the at least two separate bonding glue H, the connection relationship between the lens holder 30 and the movable lens assembly 31 may be shown as follows: (1) the bottom side of the surrounding movable member 30M directly contacts the top side of the optical filter 4; (2) the bottom side of the surrounding movable member 30M directly contacts the top side of the housing frame 2; or (3) the second topmost surrounding structure 310 directly contacts the first topmost surrounding structure 300, but it is merely an example and is not meant to limit the instant disclosure.

Second Embodiment

Figure 4:
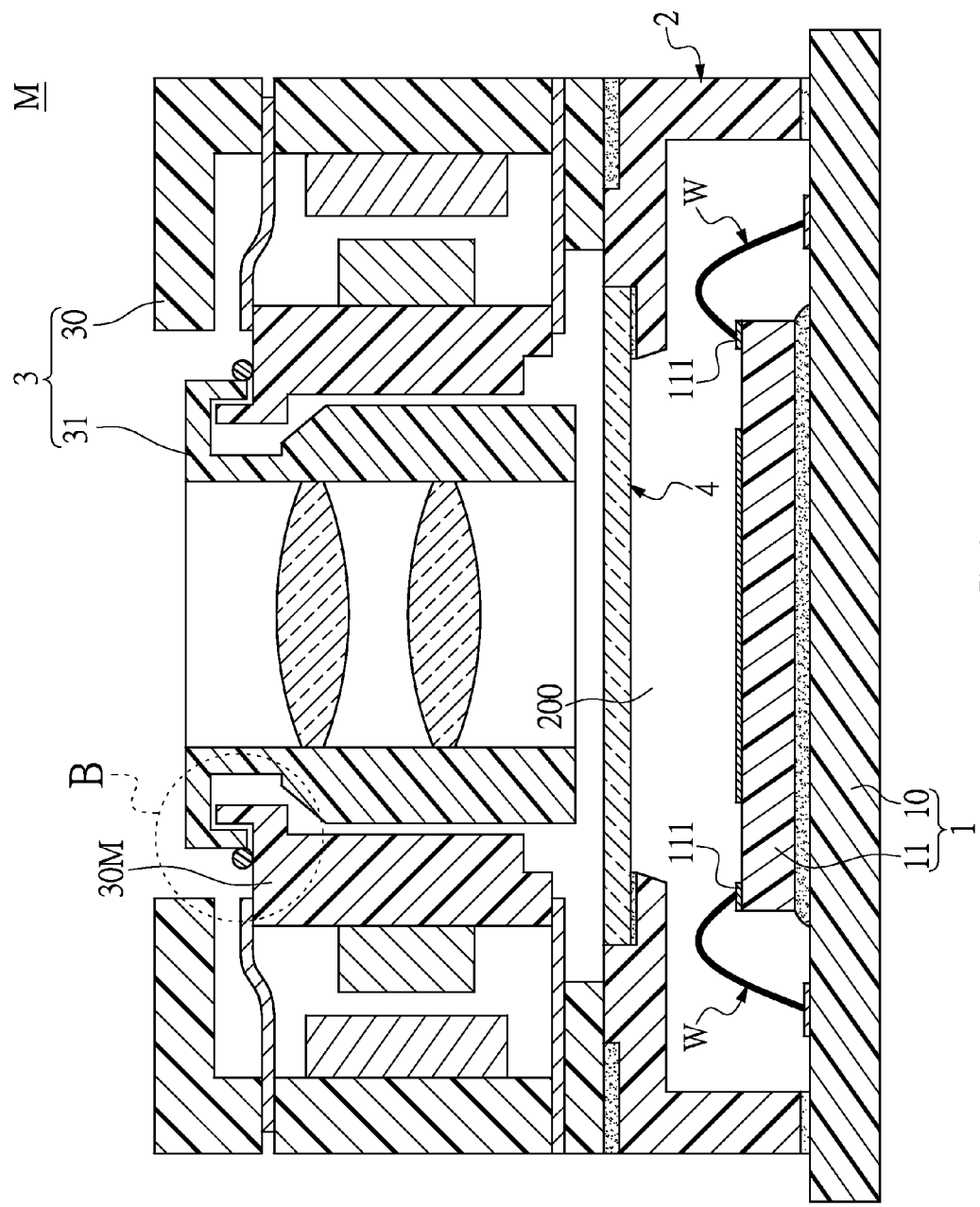
FIG. 4 shows a lateral, cross-sectional, schematic view of the image capturing module having a built-in topmost dustproof structure and using a voice coil motor actuator according to the second embodiment of the instant disclosure.
Figure 5:
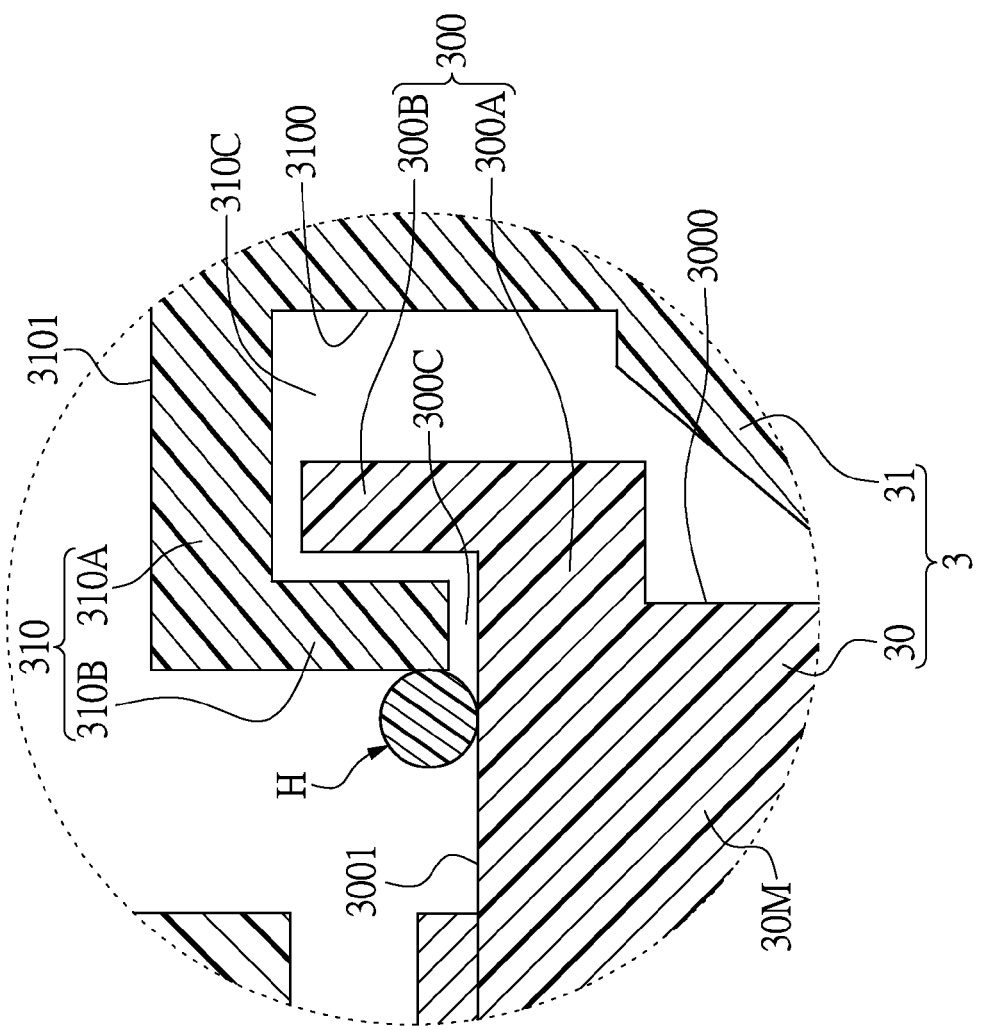
FIG. 5 is an enlarged view taken on part B of FIG. 4.

Referring to FIG. 4 and FIG. 5, FIG. 5 is an enlarged view taken on part B of FIG. 4, the second embodiment of the instant disclosure provides an image capturing module M having a built-in topmost dustproof structure, comprising: an image sensing unit 1, a housing frame 2 and an actuator structure 3. Comparing FIG. 4 with FIG. 1, and Comparing FIG. 5 with FIG. 2, the difference between the second embodiment and the first embodiment is as follows: in the second embodiment, the second topmost surrounding structure 310 has a second surrounding extending portion 310A substantially horizontally extended from the outer perimeter surface 3100 and the topmost side 3101 of the movable lens assembly 31 and substantially horizontally toward the inner surrounding surface 3000 of the movable lens assembly 30 and a second surrounding blocking portion 310B substantially downwardly and vertically extended from the second surrounding extending portion 310A, the second surrounding extending portion 310A is adjacent to the first surrounding blocking portion 300B and disposed above the first surrounding blocking portion 300B, and the first surrounding extending portion 300A is adjacent to the second surrounding blocking portion 310B and disposed under the second surrounding blocking portion 310B. In other words, the second topmost surrounding structure 310 has a second surrounding extending portion 310A substantially horizontally extended from the outer perimeter surface 3100 and the topmost side 3101 of the movable lens assembly 31 and substantially horizontally toward the inner surrounding surface 3000 of the surrounding movable member 30M and a second surrounding blocking portion 310B substantially downwardly and vertically extended from the second surrounding extending portion 310A.

More precisely, as shown in FIG. 5, the outer perimeter surface 3100, the second surrounding extending portion 310A and the second surrounding blocking portion 310B of the movable lens assembly 31 are sequentially connected to form a second surrounding receiving space 310C, wherein one portion (one part) of the first surrounding blocking portion 300B is received in the second surrounding receiving space 310C, and one portion of the second surrounding blocking portion 310B is received in the first surrounding receiving space 300C. Whereby, when the external dust passes through the gap between a non-movable external casing (not labeled) of the lens holder 30 and the second surrounding extending portion 310A of the movable lens assembly 31 to get into the built-in topmost dustproof structure that is composed of the first topmost surrounding structure 300 and the second topmost surrounding structure 310, the external dust is obstructed by the first surrounding blocking portion 300B and the second surrounding blocking portion 310B, so as to gather the external dust in the first surrounding receiving space 300C.

It is worth mentioning that when the movable lens assembly 31 is fixed inside the surrounding movable member 30M through the at least two separate bonding glue H, the connection relationship between the lens holder 30 and the movable lens assembly 31 may be shown as follows: (1) the bottom side of the surrounding movable member 30M directly contacts the top side of the optical filter 4; (2) the bottom side of the surrounding movable member 30M directly contacts the top side of the housing frame 2; or (3) the second topmost surrounding structure 310 directly contacts the first topmost surrounding structure 300, but it is merely an example and is not meant to limit the instant disclosure.

In conclusion, because the lens holder 30 has a first topmost surrounding structure 300 disposed on the inner surrounding surface 3000 and the topmost side 3001 thereof and the movable lens assembly 31 has a second topmost surrounding structure 310 disposed on the outer perimeter surface 3100 and the topmost side 3101 thereof and above the first topmost surrounding structure 300, the first topmost surrounding structure 300 of the lens holder 30 and the second topmost surrounding structure 310 of the movable lens assembly 31 can be mated with each other to form the built-in topmost dustproof structure. Whereby, when the external dust passes through the gap between a non-movable external casing (not labeled) of the lens holder 30 and the second surrounding extending portion 310A of the movable lens assembly 31 to get into the built-in topmost dustproof structure that is composed of the first topmost surrounding structure 300 and the second topmost surrounding structure 310, the external dust is obstructed by the first surrounding blocking portion 300B (or the first surrounding blocking portion 300B and the second surrounding blocking portion 310B), so as to gather the external dust in the first surrounding receiving space 300C.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. An image capturing module having a built-in topmost dustproof structure, comprising:
    an image sensing unit including a carrier substrate and an image sensing chip disposed on the carrier substrate and electrically connected to the carrier substrate;
    a housing frame disposed on the carrier substrate to surround the image sensing chip; and
    an actuator structure disposed on the housing frame and above the image sensing chip, wherein the actuator structure includes a lens holder disposed on the housing frame and a movable lens assembly movably disposed inside the lens holder;
    wherein the lens holder has a first topmost surrounding structure disposed on the inner surrounding surface and the topmost side thereof, and the movable lens assembly has a second topmost surrounding structure disposed on the outer perimeter surface and the topmost side thereof and above the first topmost surrounding structure, and the first topmost surrounding structure of the lens holder and the second topmost surrounding structure of the movable lens assembly are mated with each other to form the built-in topmost dustproof structure.

2. The image capturing module of claim 1, further comprising: an optical filter disposed on the housing frame and between the image sensing chip and the movable lens assembly, wherein the housing frame has a top opening disposed on the top side thereof and between the image sensing chip and the movable lens assembly, and the top opening of the housing frame is enclosed by the optical filter, wherein both the inner surrounding surface of the lens holder and the outer perimeter surface of the movable lens assembly are threadless surfaces or thread surfaces.

3. The image capturing module of claim 1, wherein the first topmost surrounding structure has a first surrounding extending portion substantially horizontally extended from the inner surrounding surface and the topmost side of the lens holder and toward the outer perimeter surface of the movable lens assembly and a first surrounding blocking portion substantially upwardly and vertically extended from the first surrounding extending portion, and both the first surrounding extending portion and the first surrounding blocking portion of the lens holder are sequentially connected to form a first surrounding receiving space, wherein the second topmost surrounding structure has a second surrounding extending portion substantially horizontally extended from the outer perimeter surface and the topmost side of the movable lens assembly and substantially horizontally toward the inner surrounding surface of the lens holder, and the second surrounding extending portion is adjacent to the first surrounding blocking portion and disposed above the first surrounding blocking portion.

4. The image capturing module of claim 1, wherein the first topmost surrounding structure has a first surrounding extending portion substantially horizontally extended from the inner surrounding surface and the topmost side of the lens holder and toward the outer perimeter surface of the movable lens assembly and a first surrounding blocking portion substantially upwardly and vertically extended from the first surrounding extending portion, and both the first surrounding extending portion and the first surrounding blocking portion of the lens holder are sequentially connected to form a first surrounding receiving space, wherein the second topmost surrounding structure has a second surrounding extending portion substantially horizontally extended from the outer perimeter surface and the topmost side of the movable lens assembly and substantially horizontally toward the inner surrounding surface of the lens holder and a second surrounding blocking portion downwardly and vertically extended from the second surrounding extending portion, the second surrounding extending portion is adjacent to the first surrounding blocking portion and disposed above the first surrounding blocking portion, and the first surrounding extending portion is adjacent to the second surrounding blocking portion and disposed under the second surrounding blocking portion.

5. The image capturing module of claim 4, wherein the outer perimeter surface, the second surrounding extending portion and the second surrounding blocking portion of the movable lens assembly are sequentially connected to form a second surrounding receiving space, one portion of the first surrounding blocking portion is received in the second surrounding receiving space, and one portion of the second surrounding blocking portion is received in the first surrounding receiving space.

6. An image capturing module having a built-in topmost dustproof structure, comprising:
   an image sensing unit including a carrier substrate and an image sensing chip disposed on the carrier substrate and electrically connected to the carrier substrate;
   a housing frame disposed on the carrier substrate to surround the image sensing chip; and
   an actuator structure disposed on the housing frame and above the image sensing chip, wherein the actuator structure includes a lens holder disposed on the housing frame and a movable lens assembly disposed inside the lens holder, the lens holder includes a surrounding movable member movably disposed therein, the movable lens assembly is fixed inside the surrounding movable member, and the movable lens assembly is movably disposed inside the lens holder through the surrounding movable member;
   wherein the surrounding movable member of the lens holder has a first topmost surrounding structure disposed on the inner surrounding surface and the topmost side thereof, and the movable lens assembly has a second topmost surrounding structure disposed on the outer perimeter surface and the topmost side thereof and above the first topmost surrounding structure, and the first topmost surrounding structure of the surrounding movable member and the second topmost surrounding structure of the movable lens assembly are mated with each other to form the built-in topmost dustproof structure.

7. The image capturing module of claim 6, further comprising: an optical filter disposed on the housing frame and between the image sensing chip and the movable lens assembly, wherein the housing frame has a top opening disposed on the top side thereof and between the image sensing chip and the movable lens assembly, and the top opening of the housing frame is enclosed by the optical filter, wherein both the inner surrounding surface of the surrounding movable member and the outer perimeter surface of the movable lens assembly are threadless surfaces or thread surfaces, and the bottom side of the surrounding movable member directly contacts the top side of the optical filter.

8. The image capturing module of claim 6, wherein the first topmost surrounding structure has a first surrounding extending portion substantially horizontally extended from the inner surrounding surface and the topmost side of the surrounding movable member and toward the outer perimeter surface of the movable lens assembly and a first surrounding blocking portion substantially upwardly and vertically extended from the first surrounding extending portion, and both the first surrounding extending portion and the first surrounding blocking portion of the surrounding movable member are sequentially connected to form a first surrounding receiving space, wherein the second topmost surrounding structure has a second surrounding extending portion substantially horizontally extended from the outer perimeter surface and the topmost side of the movable lens assembly and substantially horizontally toward the inner surrounding surface of the surrounding movable member, and the second surrounding extending portion is adjacent to the first surrounding blocking portion and disposed above the first surrounding blocking portion, wherein the bottom side of the surrounding movable member directly contacts the top side of the housing frame.

9. The image capturing module of claim 6, wherein the first topmost surrounding structure has a first surrounding extending portion substantially horizontally extended from the inner surrounding surface and the topmost side of the surrounding movable member and toward the outer perimeter surface of the movable lens assembly and a first surrounding blocking portion substantially upwardly and vertically extended from the first surrounding extending portion, and both the first surrounding extending portion and the first surrounding blocking portion of the surrounding movable member are sequentially connected to form a first surrounding receiving space, wherein the second topmost surrounding structure has a second surrounding extending portion substantially horizontally extended from the outer perimeter surface and the topmost side of the movable lens assembly and substantially horizontally toward the inner surrounding surface of the surrounding movable member and a second surrounding blocking portion downwardly and vertically extended from the second surrounding extending portion, the second surrounding extending portion is adjacent to the first surrounding blocking portion and disposed above the first surrounding blocking portion, and the first surrounding extending portion is adjacent to the second surrounding blocking portion and disposed under the second surrounding blocking portion.

10. The image capturing module of claim 9, wherein the outer perimeter surface, the second surrounding extending portion and the second surrounding blocking portion of the movable lens assembly are sequentially connected to form a second surrounding receiving space, one portion of the first surrounding blocking portion is received in the second surrounding receiving space, and one portion of the second surrounding blocking portion is received in the first surrounding receiving space, wherein the second topmost surrounding structure directly contacts the first topmost surrounding structure.

* * * * *